(12) United States Patent
Cassiday et al.

(10) Patent No.: US 6,684,363 B1
(45) Date of Patent: Jan. 27, 2004

(54) METHOD FOR DETECTING ERRORS ON PARALLEL LINKS

(75) Inventors: Daniel R. Cassiday, Topsfield, MA (US); Randall D. Rettberg, Danville, CA (US); David L. Satterfield, Tewksbury, MA (US); Thomas J. Moser, Acton, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 474 days.

(21) Appl. No.: 09/697,604

(22) Filed: Oct. 25, 2000

(51) Int. Cl.[7] .................... H03M 13/00; G11C 29/00
(52) U.S. Cl. .................... 714/776; 714/757; 714/772
(58) Field of Search ............................ 714/776, 757, 714/772

(56) References Cited

U.S. PATENT DOCUMENTS

| | | | | |
|---|---|---|---|---|
| 4,720,830 A | * | 1/1988 | Joshi et al. ............... | 714/775 |
| 5,426,654 A | * | 6/1995 | Hayashi et al. .......... | 714/781 |
| 5,598,424 A | * | 1/1997 | Erickson et al. ......... | 714/799 |
| 5,935,268 A | * | 8/1999 | Weaver .................... | 714/758 |
| 6,038,694 A | * | 3/2000 | Swallow ................... | 714/781 |
| 6,084,888 A | | 7/2000 | Watanabe et al. | |
| 6,173,431 B1 | * | 1/2001 | Rittle ....................... | 714/778 |
| 6,189,124 B1 | | 2/2001 | Glaise | |
| 6,252,888 B1 | | 6/2001 | Fite, Jr. et al. | |

FOREIGN PATENT DOCUMENTS

EP    1035682 A1    9/2000

OTHER PUBLICATIONS

Stephen B. Wicker, "Error Control Systems for Digital Communication and Storage", Prentice–Hall, 1995.*

* cited by examiner

*Primary Examiner*—Albert Decady
*Assistant Examiner*—Joseph D. Torres
(74) *Attorney, Agent, or Firm*—Beyer Weaver & Thomas, LLP

(57) ABSTRACT

System and method for rapidly calculating CRC values for messages including encoded bits is described. Tabularized CRC values are used in combination with a logical grid to quickly determine an appropriate CRC value of a message. This determination can take into account encoded inversion bits in the message. A collection of pre-calculated CRC values are arranged in a single-column table and then implemented with selected bits of a message by superimposing the bits in each CRC value onto a logical grid. Vertical lines of the grid are associated with 30 exclusive OR (XOR) gates and horizontal lines are associated with bits in an 88-bit message (or the 30 bits of a CRC value or with 8 bits of a sequence number). Through this grid, the inputs to the XOR gates are determined, thereby facilitating rapid calculations of CRC values due to the high processing speeds possible in XOR gates.

24 Claims, 7 Drawing Sheets

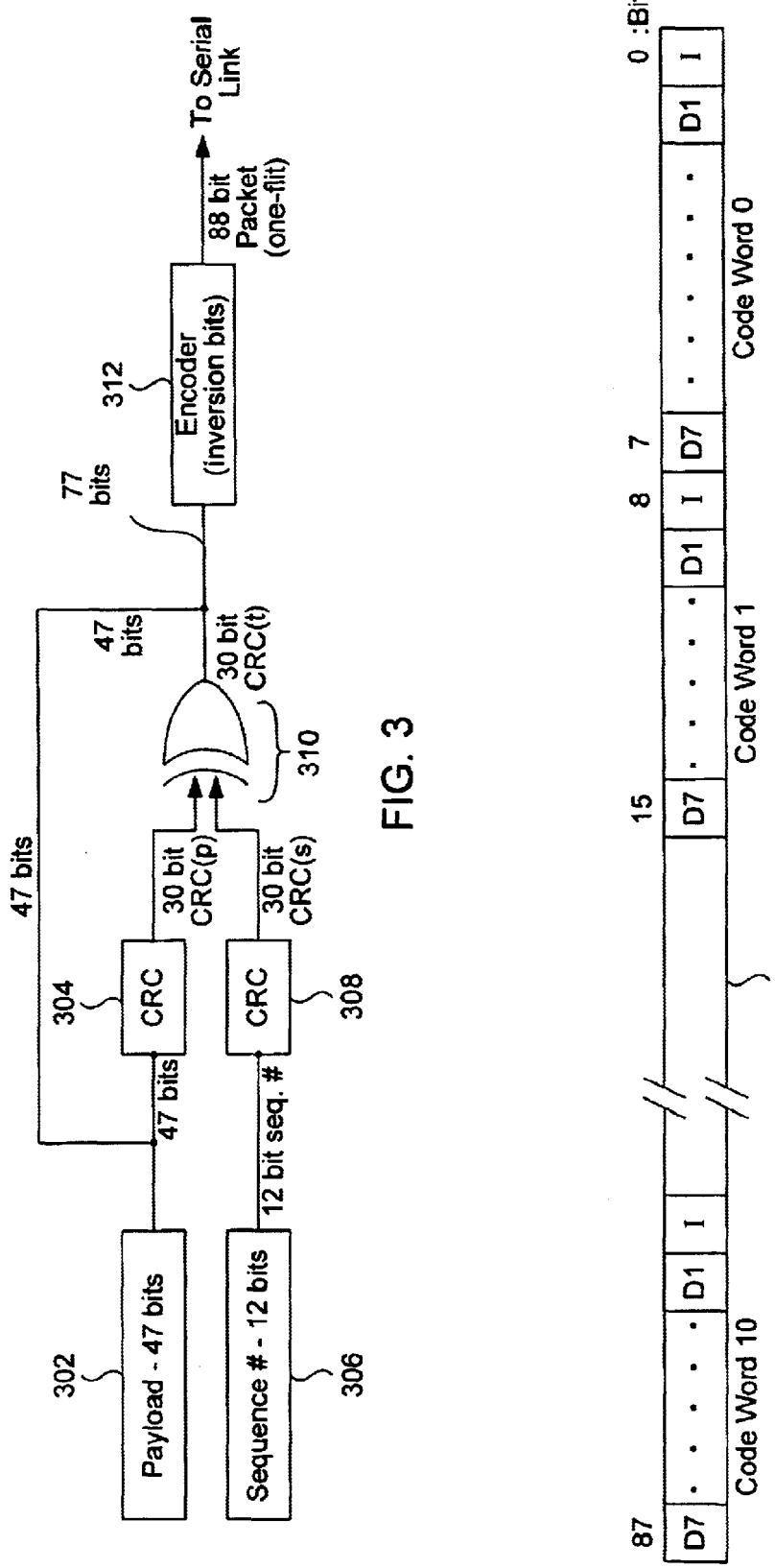

| Message Bit Position | |
|---|---|
| 0 | CRC value for bit 0 |
| 1 | CRC value for bit 1 |
| 2 | CRC value for bit 2 |
| 3 | CRC value for bit 3 |
| 4 | CRC value for bit 4 |
| ... | ... |
| 86 | |
| 87 | CRC value for bit 87 |

| CRC Feedback Bit Position | |
|---|---|
| 0 | CRC value for bit 0 |
| 1 | CRC value for bit 1 |
| 2 | CRC value for bit 2 |
| ... | ... |
| 28 | |
| 29 | |

METHOD FOR DETECTING ERRORS ON PARALLEL LINKS

CROSS-REFERENCE TO RELATED APPLICATIONS

The present application is related to U.S. patent application Ser. No. 09/697,731, filed on Oct. 25, 2000, entitled, "METHOD FOR SUPERIMPOSING A SEQUENCE NUMBER IN AN ERROR DETECTION CODE IN A DATA NETWORK", which is incorporated herein by reference.

BACKGROUND OF THE INVENTION

1. Field of the Invention

The present invention relates generally to data communication networks and the transmission of data in those networks. More specifically, it relates to hardware and data encoding modifications for increasing the throughput and reliability of data networks.

2. Discussion of Related Art

As the use of data communication networks becomes increasingly widespread, the need for reliable data transmission through nodes in such networks, the Internet being one example, has become more important. In particular, increasing the amount of data that can be sent over an interconnect link between two nodes has always been a goal of data networks. Users expect networks to deliver data faster and at the same time more reliably. One way data can be delivered with higher throughput is ensuring that the payload portion of a data packet is carrying as much actual data as possible; that is, minimizing space taken up by various encoding and CRC bits found in most data packets. These various encoding bits are necessary for ensuring that data is delivered reliably and error-free.

Presently, a significant portion of the payload of a data packet is used for transmitting packet sequence numbers, necessary for ensuring that packets are received in order and that all expected packets are received. FIG. 1 is a block diagram of a single-flit data packet excluding the packet's 11 inversion bits. Thus, only 77 of the 88 bits are shown. A typical single-flit packet has 47 bits available for carrying payload data and 30 bits used for CRC checking used for checking the accuracy of the data sent. Of the 47 bits that can be used for carrying actual data, eight bits are presently being used for transmitting a sequence number for the packet. This leaves only 39 bits, out of an 88-bit data packet for carrying payload data. By eliminating the need to transmit the sequence number data as part of the payload, the payload portion of the packet used for carrying data would increase by approximately 15%; eight extra bits in each packet.

As mentioned, each packet has 11 invert bits, one for each 8-bit word in an 88-bit packet. An invert bit indicates whether its corresponding seven bits should be inverted or left unmodified. Thus, if a single invert bit is corrupted during transmission over the link, seven other bits will appear at the receiving end as also being corrupted, when in fact they were transmitted accurately but "corrupted" at the receiving end because of the incorrect invert bit. However, the CRC check will show that all eight bits are corrupted. The CRC is presently not able to differentiate an inversion-bit (or 7-bit error) coding error as opposed to a real corrupt data error. As is known in the field, the CRC check is important; if the CRC check matches, the packet can be used, if not, the packet is considered corrupt and is dropped and resent.

Therefore, it would be desirable to increase the bandwidth of a link by utilizing the maximum number of bits in the payload segment of a data packet. This can be done by taking the sequence number of a data packet out of the payload segment and encoding it in the CRC section of a packet. It would also be desirable to have the CRC check account for various encodings in the data packet and be able to handle bursting errors on a single fiber. In addition is would be desirable to have the CRC checking performed at an increased speed.

SUMMARY OF THE INVENTION

Methods and systems for rapidly determining a CRC value for a message that takes into account encoded bits, such as DC inversion bits, to be sent on a link to a remote node is described. A system and method for rapidly calculating a CRC value for a message that takes into account encoded bits in the message, such as DC balance bits, is described. The techniques can be applied to single or multiple flit packets. A table of CRC values is used in combination with a logical grid to quickly determine an appropriate CRC value of a message. This determination is also made by taking into account the encoded inversion bits for DC balancing and prevents a burst of errors that can occur on parallel optical fiber links or from a corrupted inversion bit resulting the apparent error in its seven corresponding non-inversion bits (e.g., data bits).

In one aspect of the invention, a method of deriving a CRC value for a initial data packet having a first set of encoded bits and a sequence number is described. A first CRC value for the initial data packet having a first set of encoded bits is computed. A second CRC value for a subsequent data packet or flit having a second set of encoded bits, if the message is a multi-flit message, is computed. Both data packets are part of the same message but have different sequence numbers. The first CRC is used to modify or adjust the second CRC to take into account the encoded bits. A third CRC value for the sequence number is computed for the initial data packet. A final CRC value is calculated for the initial data packet which can be transmitted to a remote node, where the final CRC value accommodates the first set of encoded bits and the second set of encoded bits.

BRIEF DESCRIPTION OF THE DRAWINGS

The invention will be better understood by reference to the following description taken in conjunction with the accompanying drawings in which:

FIG. 3 is a block diagram illustrating various components in a node needed for transmitting a data packet with a superimposed sequence number in the CRC in accordance with one embodiment of the present invention.

FIG. 4A is an illustration of a single-flit data packet and the placement of inversion bits in accordance with one embodiment of the present invention.

FIG. 8 is an illustration of a table of CRC values for each bit in a message in accordance with one embodiment of the present invention.

FIG. 9 is an illustration of a table contained in the CRC feedback XORs component.

DETAILED DESCRIPTION

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

A system and method for rapidly calculating a CRC value for a message that takes into account encoded bits in the message, such as DC balance bits, is described. The techniques can be applied to single or multiple flit packets. A table of CRC values is used in combination with a logical grid to quickly determine an appropriate CRC value of a message. This determination is also made by taking into account the encoded inversion bits for DC balancing and prevents a burst of errors that can occur on parallel optical fiber links or from a corrupted inversion bit resulting in the apparent error in its seven corresponding non-inversion bits (e.g., data bits).

A collection of CRC values are pre-calculated using a CRC polynomial. A value is calculated for each bit in an 88-bit message where the selected bit has a value of 1 and all other bits have a value of 0. This is done for each bit and the derived CRC value is placed in a single-column table. These values are then used by superimposing the bits in each value onto a logical grid, where each bit falls on an intersection of lines. Vertical lines emanate from 30 exclusive OR gates and horizontal lines emanate from each of the 88-bits in a message (or from 30 bits in a CRC value or from 8 bits in a sequence number). Through this grid, the inputs to the XOR gates are determined and a CRC value is calculated quickly, since the XOR operations take minimal processing time. First, a method of superimposing a sequence number into a CRC value is described. This lays the foundation of the rapid CRC calculation for a message described thereafter.

Figure 1:
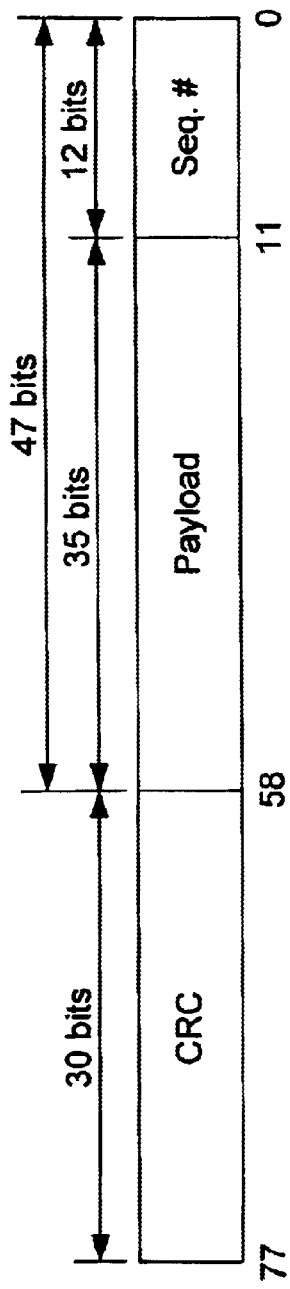
FIG. 1 is a block diagram of a single-flit data packet excluding the packet's 11 inversion bits.
Figure 2:
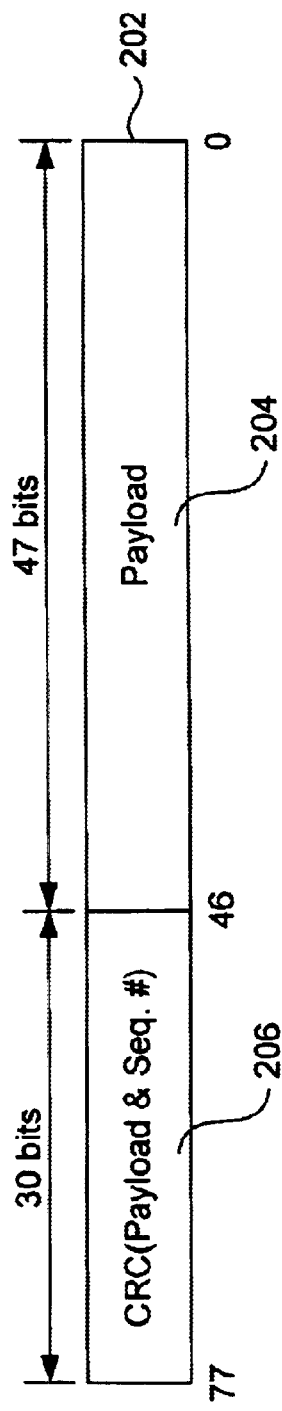
FIG. 2 is a block diagram showing the bit segments of a single-flit data packet in accordance with one embodiment of the present invention.

FIG. 2 is a block diagram showing the bit segments of a single-flit data packet in accordance with one embodiment of the present invention. A data packet 202 shows 77 bits, excluding 11 inversion bits, comprising a total of 88 bits typically transmitted in one clock cycle, i.e., one flit. Packet 202 has a total of 47 bits that can be used for transmitting payload data, shown as segment 204. A total of 30 bits is used for the CRC, shown as segment 206. The CRC segment contains a CRC for the payload and for an 8-bit sequence number of the data packet. As described above, the sequence number is typically part of the segment 204, leaving only 39 bits in the payload segment for actual data.

FIG. 3 is a block diagram illustrating various components in a node needed for transmitting a data packet with a superimposed sequence number in the CRC in accordance with one embodiment of the present invention. A payload segment 302 having 47 bits is input to a CRC generator 304. Payload segment 302 does not contain a sequence number. A sequence number segment 306 having 8 bits is input to a CRC generator 308. CRC component 304 outputs a 30-bit CRC code, labeled as CRC(p) for payload. CRC component 308 takes the 8-bit sequence number and outputs a 30 bit CRC code, referred to as CRC(s), for sequence number. The two 30-bit CRC values are then input to an XOR component 310. The two values are XORed together to produce a third 30-bit CRC value that inherently contains a CRC for the payload and the sequence number. This 30-bit CRC value is then combined with the unaltered 47-bit payload segment 302.

A 77-bit data segment is then input into an encoder 312. The encoder inserts multiple inversion bits into the 77-bit data segment. As mentioned above, a single-flit data packet has 88 bits, or 11 8-bit words. Each word has seven bits of data and one inversion bit. FIG. 4A is an illustration of a single-flit data packet and the placement of inversion bits in accordance with one embodiment of the present invention. A single-flit packet 402 has 11 code words, labeled from Code Word 0 to Code Word 10. A typical code word, such as Code Word 0, has seven data bits, bits 1 through 7, and one bit for an inversion bit, such as bit 0, and is sent across an individual data fiber. As is known in the field, an inversion bit is used to invert bits in a corresponding code word. It can be used to maintain DC balance in a data stream as well as controlling run length on fiber optic transmission media.

Once the encoder inserts a zero (leave bits unaffected) or a one (invert bits) in the inversion bit, the resulting 88-bit, single-flit, packet is transmitted onto the parallel fiber optic link. In the described embodiment, the transmitter performs the encoding of the 77-bit data packet. As mentioned, the inversion bit is needed to maintain DC balance; that is, maintaining the number of 1's and 0's over the serial link, which does not have a DC offset. In addition, the run length, the number of consecutive 0's or 1's, is kept under a threshold number.

Figure 4B:
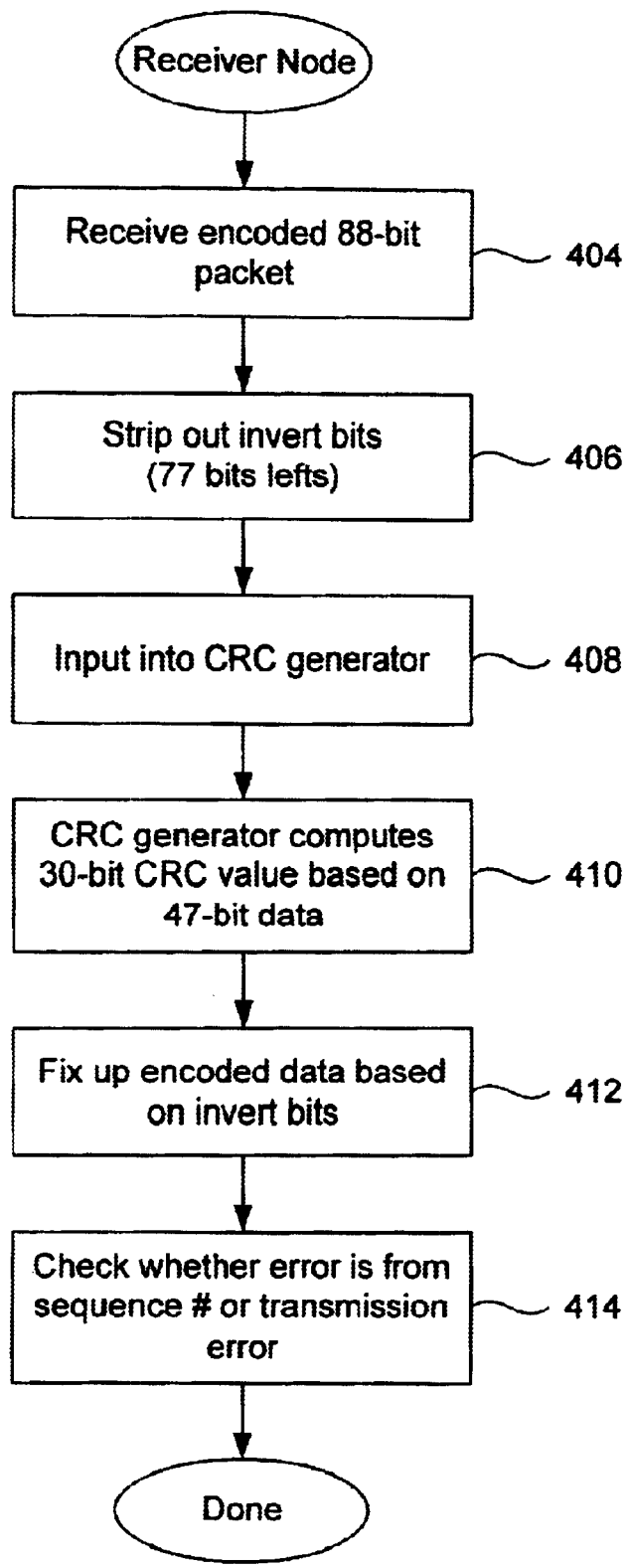
FIG. 4B is a flow diagram of a process of receiving an encoded message in accordance with one embodiment of the present invention.

FIG. 4B is a flow diagram of a process of receiving an encoded message in accordance with one embodiment of the present invention. At step 404 a receiver at the far-end node receives the encoded 88-bit message over the serial link. The composition of this 88-bit packet is described in FIG. 3. It is helpful to note here that the illustrations described here use one-flit data packets. For two and four-flit data packets, the number of bits are increased accordingly, e.g., for a two-flit data packet, the number of bits is 176 bits. At step 406 the receiver strips out the 11 invert bits contained in the packet. The actual inversion of the bits according to the invert bits is not performed at this step since such an operation slows the process down. Once the invert bits are stripped out, a 77-bit packet is inputted to a CRC generator at step 408. The CRC then separates the 47 payload bits from the 30 CRC bits. Recall from FIG. 3 that a 30-bit CRC was combined with a 47-bit payload before being inputted to an encoder in the transmitter.

At step 410 the CRC calculator computes a 30-bit CRC value on the 47-bit payload segment of the message. This is the same calculation done at the near-end node by CRC calculator 304 where a 30-bit CRC(t) value was calculated. At step 412 the CRC repairs the CRC result based on the invert bits. The 47-bit data segment has still not been decoded. The CRC then determines which bits need to be inverted or flipped based on whether each code word contributes an odd or even number of bits to each CRC result bit. In the described embodiment, this can be done using a series of exclusive OR (XOR) operations.

At step 414, the CRC checker compares the 30-bit CRC value that it calculated to the CRC(t) value calculated at the near-end node. If there are any differences in the two values, the data packet is dropped and the transmitter at the near-end node will re-send the packet since an acknowledgment will not be received from the far-end. This is done since a difference in CRC values indicates some type of error in the packet and, therefore, the packet cannot be forwarded. However, the type of error in the packet can be determined with a reasonably high degree of accuracy. In the described embodiment, the type of error in the packet can be determined by examining which CRC bits differ. If the CRC bits differ, the error can be from transmission over the link (transmission error) or from a error, sequence number error, or similar non-transmission errors. As mentioned above, an inversion bit error can cause seven other bits to have an error. Determining what type of error occurred involves examining the first 18 bits of the 30-bit CRC. If these bits are correct, i.e., all zero after the comparison, then there was very likely no error in the transmission of the message. If there are any ones, then there was very likely an error in the transmission. If the lower 12 bits have are not all zero, then there was an error in the sequence number bits or other non-transmission error. It is often useful in the maintenance of a network to have a reasonably accurate count of the number of data packet errors resulting from the transmission link versus other types of errors. A high number of transmission link errors are typically of particular concern to network administrators; these types of errors should receive attention before a catastrophic failure occurs.

Using this process at the receiver of the far-end node, the data packet can have a true 47-bit payload instead of a smaller number such as 35 bits by having the sequence number (plus an ONID value) embedded in the CRC instead of the payload. The packet still has a 30-bit CRC, which it needs to ensure that an acceptable percentage (normally a high percentage) of the packets that have an error are detected. It also accommodates the use of inversion bits and their potential associated 7-bit apparent errors, which are needed to ensure DC balance and appropriate run length.

Failures of messages passed on parallel fibers are not reliably detected if the failures are on a single fiber, or involve DC balance bits. In addition, it is desirable to compute CRC values at high speeds. In another preferred embodiment of the present invention, a message is sent over a set of parallel ribbon fiber, typically comprised of 11 data fibers, each fiber transmitting eight bits. Errors are detected using an error detection code, such as Cyclic Redundancy Check (CRC). The message bits (i.e., excluding the invert bit) are rearranged such that all the bits on a fiber are adjacent in the error detection code (CRC) calculation. This allows the burst error detection properties of the code to detect all error patterns on a single fiber. Another source of a burst error can occur, for example, when an invert bit is in error resulting in multiple message bits being in error.

As mentioned above, in order to successfully transmit data over a fiber, DC balance must be maintained. This is typically done by adding additional invert bits to the message to get a balance of zero and one bits. If one of these invert bits is received in error, it has the appearance of a burst of errors. Another example of a burst error is a bit in the same position in different flits being in error. This weakens the error detection properties of the code. In the present invention, a CRC polynomial is designed to treat this condition as a single error. In order to accomplish the error detection calculation at high speeds, a method was formulated that employs the use of exclusive OR (XOR) trees. Normally, before the CRC calculation by the receiver, the data must be encoded using the DC balance information. The present invention accomplishes the CRC calculation and DC balance calculation simultaneously.

Figure 5:
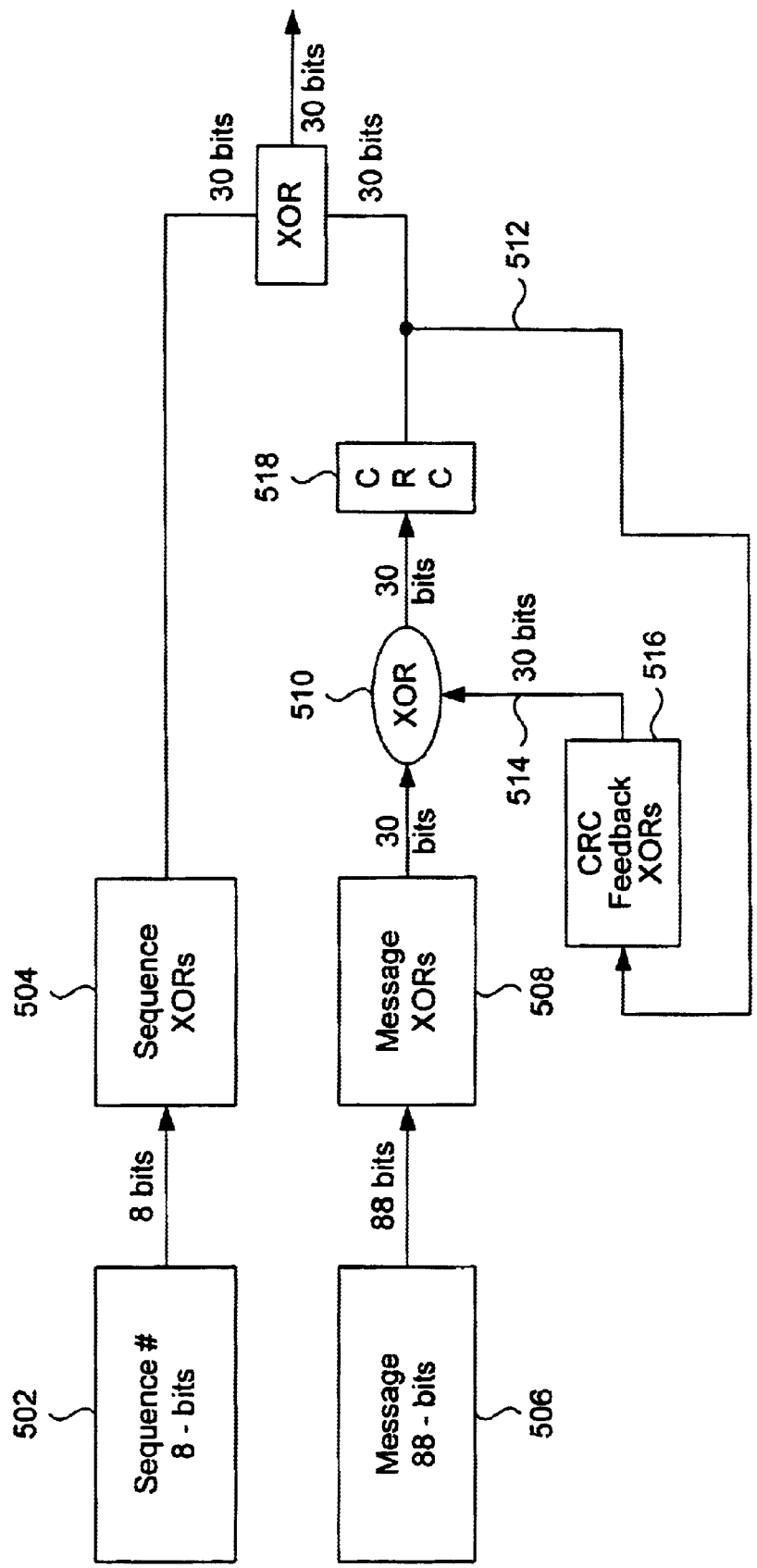
FIG. 5 is a block diagram of relevant components in a near-end or transmit node in accordance with one embodiment of the present invention.

FIG. 5 is a block diagram of relevant components in a near-end or transmit node in accordance with one embodiment of the present invention. A sequence number 502, normally 8 bits, is used as input to a series of sequence XORs 504 in which a CRC calculation is performed. A 30-bit CRC value is computed as described above. Sequence XORs component 504 also contains a grid and an eight-row table which are described below.

A message 506 can come in several different lengths: one flit (88 bits), two flits (176 bits), or four flits (352 bits). Of these bits, some are used for the CRC, typically 30 bits for a one flit packet, and other bits are used for inversion, typically 11, one for every seven bits in the packet. Assuming the sequence number is embedded or superimposed in the 30-bit CRC, this leaves 47 bits for the actual message (referred to above as payload) for every 88 bits. Selected bits of the 88 bits are used as input to a series of XOR gates 508. In the described embodiment, there are 30 XOR gates, each gate producing one bit in a 30-bit CRC value. Component 508 also contains a pre-formed CRC table, a grid (both described below), and the series of 30 XOR gates.

XOR gates 510 represent the operation of a second XOR operation of 30 XOR gates which have as one input the output from the XOR gates in message XORs 508. These comprise one 30-bit input. Another 30-bit input comes from a CRC feedback XORs 516. The function of component 516 is described below. The output from this component is also a 30-bit value which is used as a second input to XOR gates 510. The output from XOR gates 510 goes to a CRC register 518. Similar to sequence XORs 504, CRC feedback XORs 516 contain a CRC table and a series of XOR gates. It takes as input the previously calculated CRC value from the previous flit for multi-flit packets.

Figure 6:
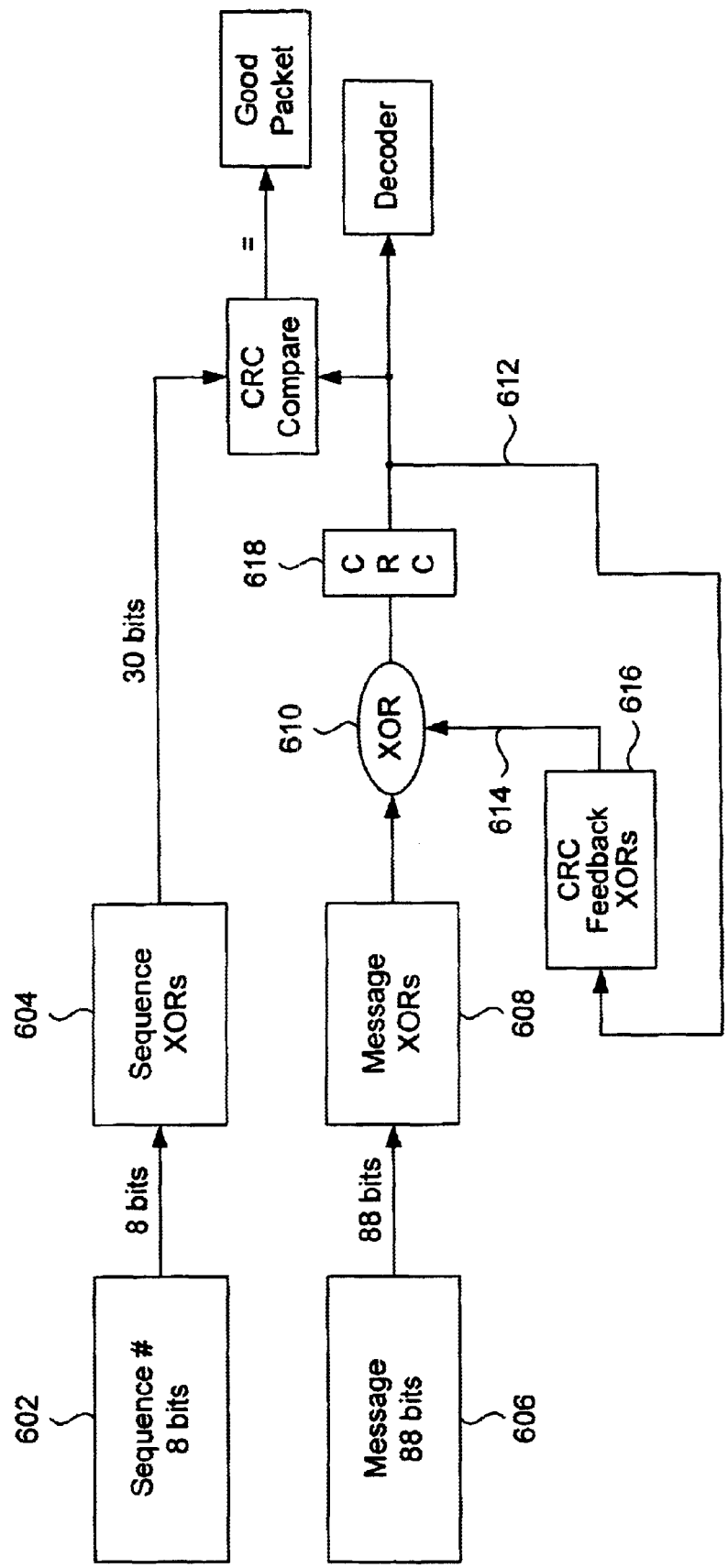
FIG. 6 is a block diagram of relevant components in a far-end or receiver end node in accordance with one embodiment of the present invention.

FIG. 6 is a block diagram of relevant components in a far-end or receiver end node in accordance with one embodiment of the present invention. A sequence number 602, normally 8 bits, is used as input to a series of sequence XORs 604 in which a CRC calculation is performed. A 30-bit CRC value is computed as described above.

A message 606 can come in several different lengths: one flit (88 bits), two flits (176 bits), or four flits (352 bits). Of these bits, some are used for the CRC, typically 30 bits for a one flit packet, and other bits are used for inversion, typically 11, one for every seven bits. Assuming the sequence number is embedded or superimposed in the 30-bit CRC, this leaves 47 bits for the actual message (referred to above as payload) for every 88 bits. Selected ones of the 88 bits are used as input to a series of message XOR gates 608. In the described embodiment, there are 30 XOR gates corresponding to a 30-bit CRC value. The other components shown, XOR gates 610, CRC register 618, and CRC feedback XORs 616 have the same role and function as their counterparts in FIG. 5 described above.

Figure 7:
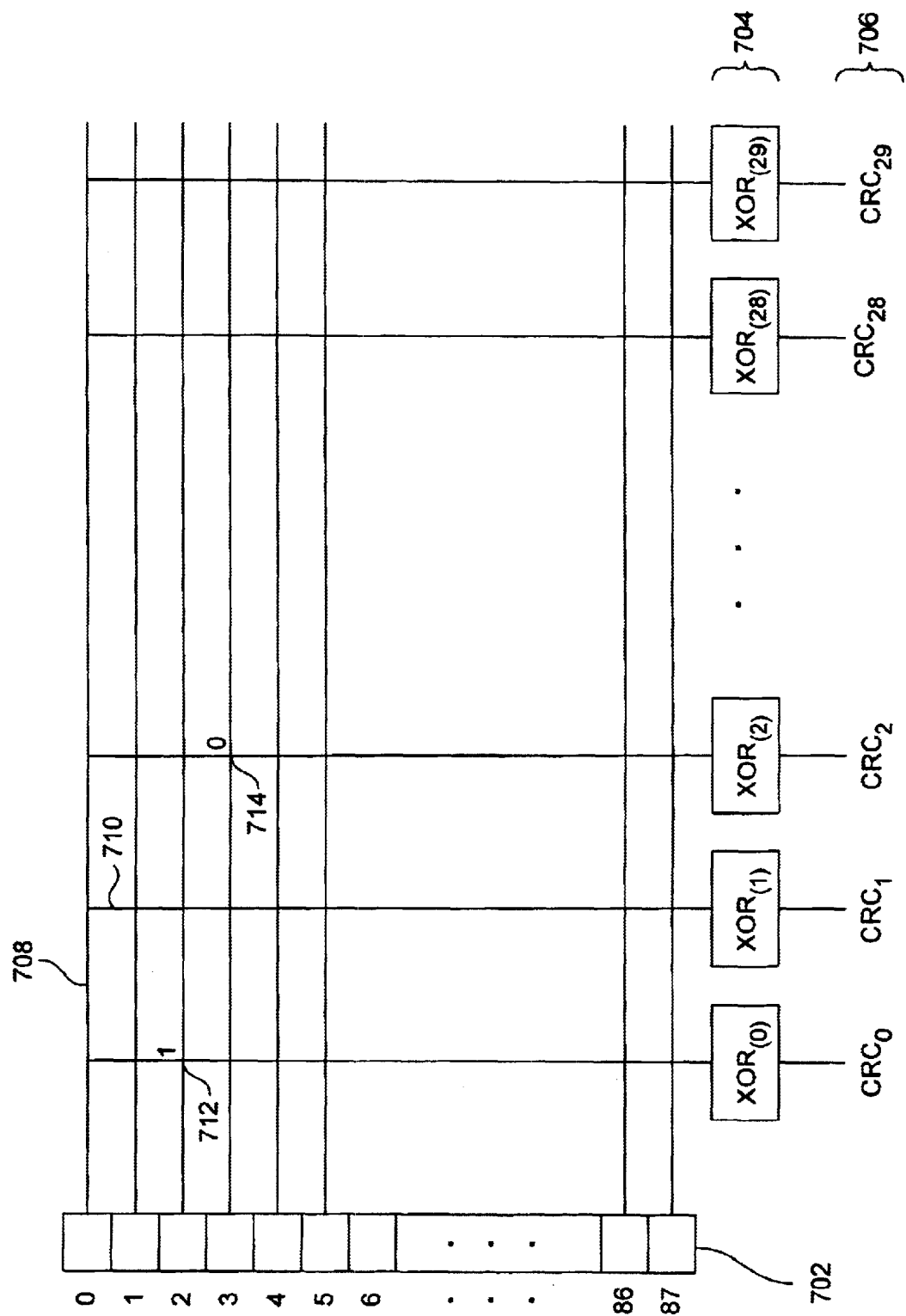
FIG. 7 is a grid-like diagram illustrating how a CRC value is rapidly computed in accordance with one embodiment of the present invention.

The message XOR boxes 508 and 608 operate according to the grid shown in FIG. 7. As shown in FIGS. 5 and 6, the message XORs receive an 88-bit message and outputs a 30-bit CRC value. FIG. 7 is a grid-like diagram illustrating how a CRC value is rapidly computed in accordance with one embodiment of the present invention. The CRC computation for a single-flit or 88-bit message is described. An 88-bit message 702 is shown vertically in FIG. 7. A series of 30 XOR gates 704 is shown horizontally. The output from each XOR gate corresponds to one bit in a CRC value 706. Each bit in the message 702 has an output connection line, such as line 708 for bit 0. Each XOR gate has an input connection line, such as line 710 for XOR(1). The input to each XOR gate depends on whether an intersection of a particular output connection line and input connection line has a one or a zero value associated with it. A method of deriving these values is described below. Briefly, a single-column table having 88 rows, one for each message bit, contains a 30-bit CRC value. These 30-bit CRC values are transposed on each intersection (of which there are 30) of each line of the grid.

For example, intersection 712 has a one associated with it and intersection 714 has a zero. For intersection 712, the value in bit position 2 (either a one or a zero) will be used as input to the first XOR gate. That is, the third bit value in the message will have some affect on the first bit value of the output 30-bit CRC. For intersection 714, the value in bit position 3 of the message will not be used as one of the inputs to the third XOR gate. Similarly, the fourth bit value in the message will have no affect on the third bit value of the CRC; it will be ignored. Each intersection (88×30) will have an associated "use/connected" or "ignore/unconnected" value, respectively 1 or 0. Thus, an 88-bit message is input into the XOR grid and each intersection has a pre-assigned "ignore" or "use" bit. As soon as the message is inputted, a 30-bit CRC value for the whole message is calculated at a high speed, since the XOR operations can be performed quickly.

FIG. 8 is an illustration of a table of CRC values for each bit in a message in accordance with one embodiment of the present invention. Table 802 has 88 rows, one row for each bit position in the message. Each entry in table 802 contains a 30-bit CRC value that was calculated for that bit position using a predetermined value, referred to as a CRC polynomial value in the described embodiment. Table 802 is prepared or built before the network is brought up. The values in table 802 are taken during execution and used to determine which bits in the message will be connected to the XOR gates. For example, the 30-bit CRC value for the third bit (bit position 2) is superimposed on the horizontal line of 30 intersections corresponding to the third bit in message 702 in FIG. 7. If an intersection gets assigned a zero, the content of the third bit in the message will not be used as input to the XOR gate below, as explained in FIG. 7.

The CRC values in table 802 are pre-computed by setting all the bits in the message to zero except for one bit. For example, to compute the CRC value for bit position 0, the content of that bit is set to 1 and all the other bits are set to zero. The CRC polynomial, itself a 30-bit value, is used to divide the value of the 88-bit message having only the first bit set to 1 and all others set to 0. The checksum or remainder from this calculation is used to derive the CRC value for the first bit. Similarly, for the second bit, bit position 1 is set to 1 and all other bits are set to zero. The resulting value of the 88-bit message is divided by the preselected CRC polynomial and the checksum is used to derive the CRC value for the second bit. Through this process the CRC values for each bit in the message is calculated and table 802 is populated with the values. More generally, a value is derived from each message bit's contribution to the checksum.

The above examples describe a single-flit message. In the case of two or four flit messages, the CRC value calculated from the previous 88-bits is also used as input to XOR gates 704 in FIG. 7. This is shown by lines 512 and 514 in FIG. 5 and lines 612 and 614 in FIG. 6. CRC feedback XORs 516 and 616 contain 30 XOR gates and a grid similar to that shown in FIG. 7. The difference is that there is a 30-bit input instead of an 88-bit input and the table used for determining which connections are connected and which are ignored has 30 rows instead of 88. An illustration of this table is shown in FIG. 9. This is done for each new incoming flit that belongs to a single message. The CRC feedback XORs 516 and 616 are there to address the CRC computed for the previous flit in multi-flit packets. The CRC of the first flit is shifted over or mutated to ensure that it is unique in that it does not match any other checksum from any other bit. By shifting or mutating the CRC value in the box 516 or 616, the value that is contributed to the next CRC value is changed and this prevents the inadvertent canceling of bits. The output from the CRC feedback XORs is another 30-bit CRC value that is used as a second input to the XOR gates.

The sequence XORs components also have a table similar to the ones described above except that the table has eight rows, one for each input bit. The values in the table is also the CRCs that each bit in the sequence number will produce. That is, derive a 30-bit value (a CRC value) that each bit in the sequence number would have produced as its contribution to the checksum. This can be done by setting one bit in the input to one and the rest to zero and determining a CRC value. This is done for each bit in the sequence number and the corresponding values are stored in the table and applied to the XOR grid, similar to the one shown in FIG. 7. In this manner a CRC value is derived rapidly by performing the XOR functions.

FIG. 9 is an illustration of a table contained in the CRC feedback XORs component. A table 902 is used in CRC feedback XORs 516 and 616 in the same manner as table 802. The 30-bit CRC values are superimposed on the grid shown in FIG. 7. Each CRC entry in table 902 has a value that each bit in the feedback CRC will produce using the same CRC polynomial if desired. The method of examining the checksum to derive the CRC value described above is used in the same manner to derive the CRC values in table 902.

All values stored in the three tables described are unique; no two are the same. This is true so that two bits in the message, in the feedback CRC, or in the sequence number will not cancel each other out. More specifically, the 30-bit table values of the two bits will not cancel each other out. This assurance that bits will not cancel each other out can be extended to more bits by performing an XOR operation. For example, if the XOR of the value of any two other bits is different from a third bit, then it is assured that three bits in the input will not cancel one another out. This is done in ensure that an error in the message can be detected using the CRC.

In addition, the DC balance or invert bits that are encoded in the 88-bit message must also be taken into account when calculating and checking the CRC. As mentioned above, each entry in table 802 used in the message XORs has a 30-bit CRC value for every bit in the message. However, not all bits in the message have the same role; some are data bits and some are invert bits. Generally, every eighth bit, starting with bit 0, is an invert bit. Thus, bit 0, bit 8, bit 16, and so on are invert bits. Each invert bit encodes the succeeding 7 bits (e.g., invert bit 0 encodes bits 1 to 7, invert bit 8 encodes bits 9 to 15). The CRC values in the table for the invert bits are calculated in a special way. A CRC value is initially calculated for each invert bit in the same way it is done for the other non-invert bits described above by using the CRC polynomial performing the division, and using the checksum. This is necessary to ensure that an appropriate polynomial is being used in that all the CRC values in the tables have to be unique. This also avoids an invert bit error from causing a burst of errors in the message.

Once CRC values in the table for each invert bit is derived, along with the values for all the other bits, the CRC values for the invert bit are modified. An XOR operation is performed on the CRC values of the seven data bits corresponding to the invert bit. The resulting valued from the XOR operation on the seven values is then stored in the entry for the invert bit. This is done for all eleven invert bits. As described, the job of the invert bit is to maintain DC balance in the message stream. Normally, this is their sole function. Thus, in the grid of FIG. 7, before their values are inputted to the XOR gates (that is, those values that get through because the connection is connected), they are discarded; they do not affect the output of the XOR gates and thus do not affect the CRC value. In this manner, an error in the DC balance bits only has the same impact that a single bit error would have instead of causing an apparent error in its seven corresponding bits.

Although the foregoing invention has been described in some detail for purposes of clarity of understanding, it will be apparent that certain changes and modifications may be practiced within the scope of the appended claims. Furthermore, it should be noted that there are alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of deriving a Cyclic Redundancy Check (CRC) value for an initial data packet having a first set of encoded bits and a sequence number, the method comprising:
   computing a first CRC value for the initial data packet, the initial data packet having a first set of encoded bits and being associated with a sequence number;
   computing a second CRC value for a subsequent data packet having a second set of encoded bits;
   modifying the first CRC value with the second CRC value;
   computing a third CRC value for the sequence number of the initial data packet; and
   deriving a fourth CRC value for the initial data packet which can be transmitted to a remote node, wherein the fourth CRC value accommodates the first set of encoded bits and the second set of encoded bits.

2. A method as recited in claim 1 further comprising performing a plurality of exclusive OR operations to compute the first CRC value and the second CRC value.

3. A method as recited in claim 2 further comprising deriving each bit of the first and second CRC values from one of the plurality of exclusive OR operations.

4. A method as recited in claim 1 wherein modifying the first CRC value with the second CRC value further comprises combining the output of a first set of exlusive OR operations with the output from a second set of exclusive OR operations.

5. A method as recited in claim 1 wherein computing a third CRC value for the sequence number of the initial data packet further comprises:
   inputting a sequence number having a first number of bits into plurality of exclusive OR gates; and
   outputting the third CRC value having a second number of bits.

6. A method as recited in claim 5 wherein the first number of bits is eight bits and the second number of bits is 30 bits.

7. A method as recited in claim 1 wherein deriving the fourth CRC value further comprises performing a series of exclusive OR operations between the third CRC value and a fifth CRC value.

8. A method as recited in claim 7 further comprising deriving the fifth CRC value from the first and second CRC values.

9. A node in an interconnect system having a plurality of nodes, the node associated with:
   a plurality of CRC values, a CRC value corresponding to a bit position in an incoming message, wherein a CRC value is calculated using a predetermined CRC constant for each bit position in the incoming message;
   a first CRC table containing a first subset of CRC values from the plurality of CRC values; and
   a second CRC table containing a second subset of CRC values from the plurality of CRC values.

10. A node as recited in claim 9 wherein a CRC value from the plurality of CRC values is used to determine a plurality of input values to a plurality of exclusive OR gates which output a first computed CRC value.

11. A node as recited in claim 9 wherein a CRC value is calculated by dividing a specially designated message by the predetermined CRC constant.

12. A node as recited in claim 11 wherein the specially designated message has one bit set to one and remaining bits set to zero.

13. A node as recited in claim 9 wherein the first CRC table contains 88 rows, a row for one bit in a first incoming message and the second CRC table contains 30 rows, a row for one bit in a second incoming message.

14. A node as recited in claim 13 wherein the second incoming message is a modified CRC value.

15. A node as recited in claim 9 further comprising a logical grid having a plurality of horizontal lines and a plurality of vertical lines wherein a horizontal line corresponds to a bit in the incoming message and a vertical line corresponds to a bit in the CRC value.

16. A node as recited in claim 15 wherein the plurality of vertical lines is input to a plurality of exclusive OR gates, an exclusive OR gate outputting a single bit in the CRC value.

17. A method of preparing a data packet for transmission over an interconnect link, the method comprising:
   providing a data packet having a payload segment with a sequence number;
   calculating a first CRC value for a payload segment of a data packet;
   calculating a second CRC value for a sequence number of the data packet;
   combining the first CRC value and the second CRC value to produce a third CRC value that contains the first and second CRC values;
   combining the payload segment with the third CRC value; and
   encoding the combing payload segment and third CRC value to create a transmittable data packet.

18. The method of claim 17 wherein combining the first CRC value and the second CRC value to produce a third CRC value comprises exclusive ORing the first CRC value and the second CRC value to produce a third CRC value.

19. The method of claim 17 wherein encoding the combing payload segment and third CRC value includes inserting a plurality of inversion bits into the transmittable data packet.

20. The method of claim 19 wherein inserting a plurality of inversion bits into the transmittable data packet accomplishes DC balance in the transmittable data packet.

21. The method of claim 19 wherein inserting a plurality of inversion bits into the transmittable data packet controls the run length of the transmittable data packet in a fiber optic transmission media.

22. The method of claim 19 wherein inserting a plurality of inversion bits into the transmittable data packet includes inserting a plurality of inversion bits such that the number of consecutive "0"s and "1"s is less than a threshold value.

23. A method of receiving an encoded data packet over an interconnect link, the method comprising:

receiving a data packet including an encoded payload segment, a sequence number, inversion bits, and a CRC code formed using the encoded payload segment and the sequence number;

removing the inversion bits from the data packet;

separating the encoded payload segment from the sequence number;

calculating a payload CRC value for the encoded payload segment of the data packet;

using the inversion bit to repair portions of payload CRC needing repair;

determining if the received CRC code, formed using the encoded payload segment and the sequence number, is correct:

where the received CRC code is incorrect the data packet is discarded, and where the received CRC code is correct the data packet is properly received.

24. The method of claim 23 wherein the CRC code formed using the encoded payload segment and the sequence number includes a thirty (30) bit CRC code having a first set of eighteen (18) bits and a second set of twelve (12) bits;

wherein the received CRC code is determined to be incorrect, the method further comprises, examining which bits of the CRC code are in error to determine the cause of an error in the CRC code;

if the first set of eighteen bits are correct, the error is a non-transmission error, if the first set of eighteen bits are incorrect, the error is a transmission error, and if the second set of twelve bits are incorrect the error is at least one of a non-transmission error and error in the sequence number.

\* \* \* \* \*